(12) United States Patent
Ide et al.

(10) Patent No.: US 7,376,297 B2
(45) Date of Patent: May 20, 2008

(54) OPTICAL DEVICE

(75) Inventors: Akiyoshi Ide, Kasugai (JP); Yasunori Iwasaki, Nishikasugai-Gun (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/668,661

(22) Filed: Jan. 30, 2007

(65) Prior Publication Data

US 2007/0183708 A1 Aug. 9, 2007

(30) Foreign Application Priority Data

Feb. 3, 2006 (JP) ............................. 2006-027028
Dec. 20, 2006 (JP) ............................. 2006-342853

(51) Int. Cl.
*G02B 6/28* (2006.01)
(52) U.S. Cl. ............................. 385/24; 385/14; 385/91
(58) Field of Classification Search ................. 385/14, 385/24, 88–91
See application file for complete search history.

(56) References Cited

U.S. PATENT DOCUMENTS

| | | | |
|---|---|---|---|
| 4,630,255 A | 12/1986 | Gouali et al. | |
| 4,634,215 A | 1/1987 | Reule | |
| 4,961,801 A | 10/1990 | Gasparian | |
| 5,031,984 A | 7/1991 | Eide et al. | |
| 6,327,407 B1 * | 12/2001 | Mitsuda et al. | ................ 385/49 |
| 6,406,196 B1 * | 6/2002 | Uno et al. | ..................... 385/89 |
| 6,535,655 B1 | 3/2003 | Hasui et al. | |
| 6,731,837 B2 | 5/2004 | Goldberg et al. | |
| 6,793,410 B2 * | 9/2004 | Nakanishi et al. | ............. 385/92 |
| 6,850,674 B2 * | 2/2005 | Haraguchi et al. | ............ 385/49 |
| 7,024,079 B2 | 4/2006 | Komiya et al. | |
| 7,308,174 B2 * | 12/2007 | Fukuyama et al. | ........... 385/49 |
| 2005/0117831 A1 | 6/2005 | Komiya et al. | |

FOREIGN PATENT DOCUMENTS

| | | |
|---|---|---|
| DE | 42 05 750 A1 | 8/1993 |
| EP | 1 321 790 A2 | 6/2003 |
| JP | 1-307707 A1 | 12/1989 |
| JP | 116941 | 1/1999 |
| JP | 2001-094191 | 4/2001 |
| JP | 2003-294990 | 10/2003 |

(Continued)

OTHER PUBLICATIONS

U.S. Appl. No. 11/668,648, filed Jan. 30, 2007, Ide et al.
Kogyo Tsushin Co., Ltd., "Structure of triplexer type BI-DI", Drawing only (p. 38), OPTCOM No. 180, Mar. 2004, pp. 30-38 (and English translation of Drawing on p. 38).

(Continued)

*Primary Examiner*—Ellen E. Kim
(74) *Attorney, Agent, or Firm*—Burr & Brown (57) ABSTRACT

An optical device has an optical fiber, an optical demultiplexer having an optical demultiplexing member for demultiplexing a portion of an optical signal beam transmitted through the optical fiber, as a demultiplexed optical signal beam, and guiding the demultiplexed optical signal beam out of the optical fiber, an optical path changer for changing an optical path of the demultiplexed optical signal beam guided out of the optical fiber, a waveguide serving as at least a medium from which the demultiplexed optical signal beam is emitted to the optical path changer, and a filter disposed on a surface of the waveguide. An angle of incidence of the demultiplexed optical signal beam on the filter is equal to or greater than 0.5°.

10 Claims, 8 Drawing Sheets

FOREIGN PATENT DOCUMENTS

| | | |
|---|---|---|
| JP | 2003-294992 | 10/2003 |
| JP | 2003-295000 | 10/2003 |
| JP | 2003-344711 | 12/2003 |
| JP | 2005-055475 | 3/2005 |
| WO | 03/060584 | 7/2003 |
| WO | 03/096095 | 11/2003 |
| WO | 03/098293 | 11/2003 |

OTHER PUBLICATIONS

Sato, Eisuke, et al., "Optical Transceiver Module for Access Systems", Hitachi Communication Technologies, Ltd., OPTRONICS (2004), No. 1, pp. 172-177 (and partial English translation).

Matsuhiro, Keiji, et al., "Standards of Optical Fiber Arrays and Future Trend—Toward Expansion of Use of Collective Connection Products of Multi-core Optical Fiber", Optical Alliance, vol. 17, No. 11, Industrial Publishing Co., Ltd., Nov. 2005 (and partial English translation), pp. 4-6.

* cited by examiner

$\theta 1 + \theta 2 < 90°$

FIG. 3B

$\theta 1 + \theta 2 > 90°$

FIG. 4A

$\theta 1 + \theta 2 = 90°$

FIG. 4B $\theta 1 + \theta 2 = 90°$

OPTICAL DEVICE

CROSS-REFERENCE TO RELATED APPLICATIONS

This application is based upon and claims the benefit of priority from Patent Application No. 2006-027028 filed on Feb. 3, 2006 and Patent Application No. 2006-342853 filed on Dec. 20, 2006, in the Japanese Patent Office, of which the contents are incorporated herein by reference.

BACKGROUND OF THE INVENTION

1. Field of the Invention

The present invention relates to an optical device suitable for use as a wavelength-multiplex optical terminal for demultiplexing a light beam in a particular wavelength range from signal light beams in various wavelength range, i.e., light beams of communication service signal or video signal light beams, transmitted through an optical fiber.

2. Description of the Related Art

With the recent development of wavelength-multiplex communications using a fiber amplifier, it has become customary to monitor the amounts of optical signals at respective wavelengths, adjust the amounts of optical signals, and then have an amplifier amplify the optical signals in order to maintain desired amplifier characteristics.

Various processes are known for monitoring the amounts of optical signals. According to the known processes, since monitor devices are associated with respective optical fibers, they are alone required to have a considerable size.

There have been demands for a small-size monitor device which is packaged with high density. A monitor device monitors an optical signal by extracting a portion of the optical signal. It is desirable for a monitor device to be able to monitor an optical signal without significantly attenuating the optical signal.

Heretofore, solutions to the above problems and demands have been proposed in Japanese Laid-Open Patent Publication No. 2003-294990, Japanese Laid-Open Patent Publication No. 2003-294992, Japanese Laid-Open Patent Publication No. 2003-295000, WO03/096095, WO03/060584, and WO03/098293.

In recent years, attempts have been made to add broadcasting services as new value-added services to FTTH (Fiber To The Home) services. A broadcasting downstream signal wavelength is added to upstream and downstream signal wavelengths of IP (Internet Protocol) services through a single optical fiber in the new services. In other words, combined services for communication and broadcasting by the single-core, three-wavelength optical fiber have been proposed.

In order to realize such combined communication and broadcasting services, a customer premises facility is required to include a B-ONU (Broadband Optical Network Unit) that is need for conventional IP services and a V-ONU (Video-Optical Network Unit) for receiving broadcasting services. Stated otherwise, the subscriber needs to have a wavelength-multiplexing optical terminal for processing upstream and downstream signals having different wavelengths. In the future, there is a possibility to transmit a downstream video signal at another wavelength, and a wavelength-multiplexing optical terminal for three wavelengths will be required to handle all those signals.

The wavelength-multiplexing optical terminal mainly comprises a WDM (Wavelength Division Multiplexing) filter, a light-detecting unit (e.g., a photodiode) for receiving a downstream signal, and a light-emitting device (e.g., a laser diode) for transmitting an upstream signal.

For demultiplexing wavelengths with WDM filters, ordinary filters are required to have an attenuating level of about 25 dB in the cut-off range, but filters designed to meet special specifications are required to have an attenuating level of about 40 dB in the cut-off range. As shown in OPTCOM, March 2004, page 38, a bandpass filter (rejection filter) may be inserted between a WDM prism and a light-detecting unit.

Conventional wavelength-multiplexing optical terminals are mainly classified into a microoptics design using a lens and a PLC design using an optical waveguide, as shown in OPTORONICS, January 2004, page 173.

Since both designs employ a light transmitting component such as a lens or an optical waveguide for guiding optical signals to a WDM filter, it is necessary to meet a most important requirement for optical components, i.e., optical alignment between the optical fiber and the light transmitting component. Accordingly, the cost of the resultant assembly tends to be high and the connection is liable to be of low reliability.

For providing combined communication and broadcasting services inexpensively, there has been proposed a V-ONU-compatible optical device having an integrated combination of a WDM function based on the microslitting technology (see "Standards of optical fiber arrays and future trend", OPTICAL ALLIANCE, November 2005) for directly slitting an optical fiber, and a light-detecting function.

The V-ONU-compatible optical device fabricated according to the microslitting technology comprises a wavelength-demultiplexing thin-film substrate inserted in an oblique silt directly defined in an optical fiber and a light-detecting component disposed above the optical fiber for detecting an optical signal beam demultiplexed by the wavelength-demultiplexing thin-film substrate. The V-ONU-compatible optical device thus constructed is inexpensive to manufacture, and yet incorporates an integrated combination of the wavelength-demultiplexing function and the light-detecting function.

A bandpass filter may be disposed on the optical path of the demultiplexed optical signal beam in order to increase the optical signal beam attenuation in the cut-off range.

SUMMARY OF THE INVENTION

It is an object of the present invention to provide an optical device fabricated according to the microslitting technology and having a bandpass filter disposed on the optical path of a demultiplexed optical signal beam, for effectively attenuating light reflected from the bandpass filter to increase the characteristics of an overall system which incorporates a V-ONU-compatible optical device.

An optical device according to the present invention comprises an optical fiber, an optical demultiplexer having an optical demultiplexing member for demultiplexing a portion of an optical signal beam transmitted through the optical fiber, as a demultiplexed optical signal beam, and guiding the demultiplexed optical signal beam out of the optical fiber, an optical path changer for changing an optical path of the demultiplexed optical signal beam guided out of the optical fiber, a waveguide serving as at least a medium from which the demultiplexed optical signal beam is emitted to the optical path changer, and a filter disposed on a surface of the waveguide, wherein an angle of incidence of the demultiplexed optical signal beam on the filter is equal to or greater than 0.5°.

The demultiplexed optical signal beam from the optical demultiplexing member has its optical path changed by the optical path changer, and is emitted through the filter on the surface of the waveguide into air, for example. If the demultiplexed optical signal beam is applied perpendicularly to the filter, a portion of the demultiplexed optical signal beam may be reflected by the surface of the filter, i.e., the interface between the filter and air, and return as a reflected beam to the optical path changer, the optical demultiplexer, and the optical fiber.

In broadcasting services provided through the optical fiber, it is necessary to produce a large optical signal output level, and reflected beams should desirably be reduced because even weak reflected beams tend to serve as an unstable element in the overall system.

According to the present invention, the angle of incidence of the demultiplexed optical signal beam on the filter is equal to or greater than 0.5°. The angle of incidence thus selected allows the attenuated level of the reflected beam to be at least −30 dB or less, for thereby greatly reducing the effect of the reflected beam.

The optical device according to the present invention is fabricated according to the microslitting technology and has the bandpass filter placed on the optical path of the demultiplexed optical signal beam. The optical device is capable of effectively attenuating the beam reflected from the bandpass filter. Consequently, the optical device allows a system incorporating a V-ONU-compatible optical device to have improved overall characteristics.

At least a medium from which the beam is emitted to the optical path changer comprises the waveguide, and the filter is disposed on the waveguide. Consequently, the medium to which the beam is emitted from the optical path changer (changing its optical path) and the medium from which the beam is applied to the filter are identical to each other. Therefore, the medium is optically uniform for improved and stable characteristics.

According to the present invention, in view of the diffraction angle (spreading angle) of the demultiplexed optical signal beam, the angle of incidence of the demultiplexed optical signal beam on the filter should preferably be equal to or greater than 1°.

According to the present invention, preferably, the optical path changer comprises a totally reflecting mirror, and if it is assumed that the totally reflecting mirror is inclined to the optical axis of the optical fiber by an angle θ1, an angle θ2 is formed between the demultiplexed optical signal beam reflected by the totally reflecting mirror and the totally reflecting mirror, and the optical filter is inclined to the optical axis of the optical fiber by an angle θ3, then the angles satisfy the following equation:

$$|\{(\theta1+\theta2)-90°\}+\theta3|\leq 0.5°.$$

The angle θ3 of inclination may include 0°.

According to the present invention, the optical demultiplexer should preferably have a slit defined in the optical fiber across an optical axis thereof, and an optical demultiplexing member inserted in the slit for demultiplexing the portion of the optical signal beam transmitted through the optical fiber.

According to the present invention, the optical demultiplexing member may comprise a wavelength demultiplexing filter, and the filter disposed on a surface of the waveguide may comprise a bandpass filter for passing a light beam in a particular wavelength range of the demultiplexed optical signal beam. The bandpass filter may have an attenuating level of about 40 dB, for example, in the cut-off range, providing increased isolation between the pass range and the cut-off range.

According to the present invention, if the waveguide serves as both a medium from which the beam is emitted to the optical path changer and to which the beam is emitted from the optical path changer, then not only the beam is emitted (changing its optical path) from the optical path changer and applied to the bandpass filter, but also the beam is applied to the optical path changer, through the same medium, whereby a more uniform optical path can desirably be achieved.

For reducing the length of the optical path and enhancing the optical uniformity of the optical path of the demultiplexed optical signal beam, the waveguide may be disposed directly above the optical fiber.

According to the present invention, the optical path changer may comprise a guide, the waveguide and the guide being juxtaposed on a surface of the optical fiber, and a totally reflecting film disposed on an end face of the guide which faces the waveguide.

According to the present invention, the optical path changer may comprise a totally reflecting film disposed on an end face of the waveguide which is present on the optical path of the demultiplexed optical signal beam. With this arrangement, the guide which is referred to above may be dispensed with.

As can be understood from the foregoing description, according to the present invention, the light-detecting device disposed on the optical path of the beam that has passed through the filter disposed on the surface of the waveguide makes it possible to provide an excellent wavelength-multiplexing receiving device.

As described above, the optical device according to the present invention is fabricated according to the microslitting technology and has the bandpass filter placed on the optical path of the demultiplexed optical signal beam. The optical device is capable of effectively attenuating the beam reflected from the bandpass filter. Consequently, the optical device allows a system incorporating a V-ONU-compatible optical device to have improved overall characteristics.

The above and other objects, features, and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Optical devices according to embodiments of the present invention will be described below with reference to FIGS. 1 through 8. Like or corresponding parts are denoted by like or corresponding reference characters throughout views.

Figure 1:
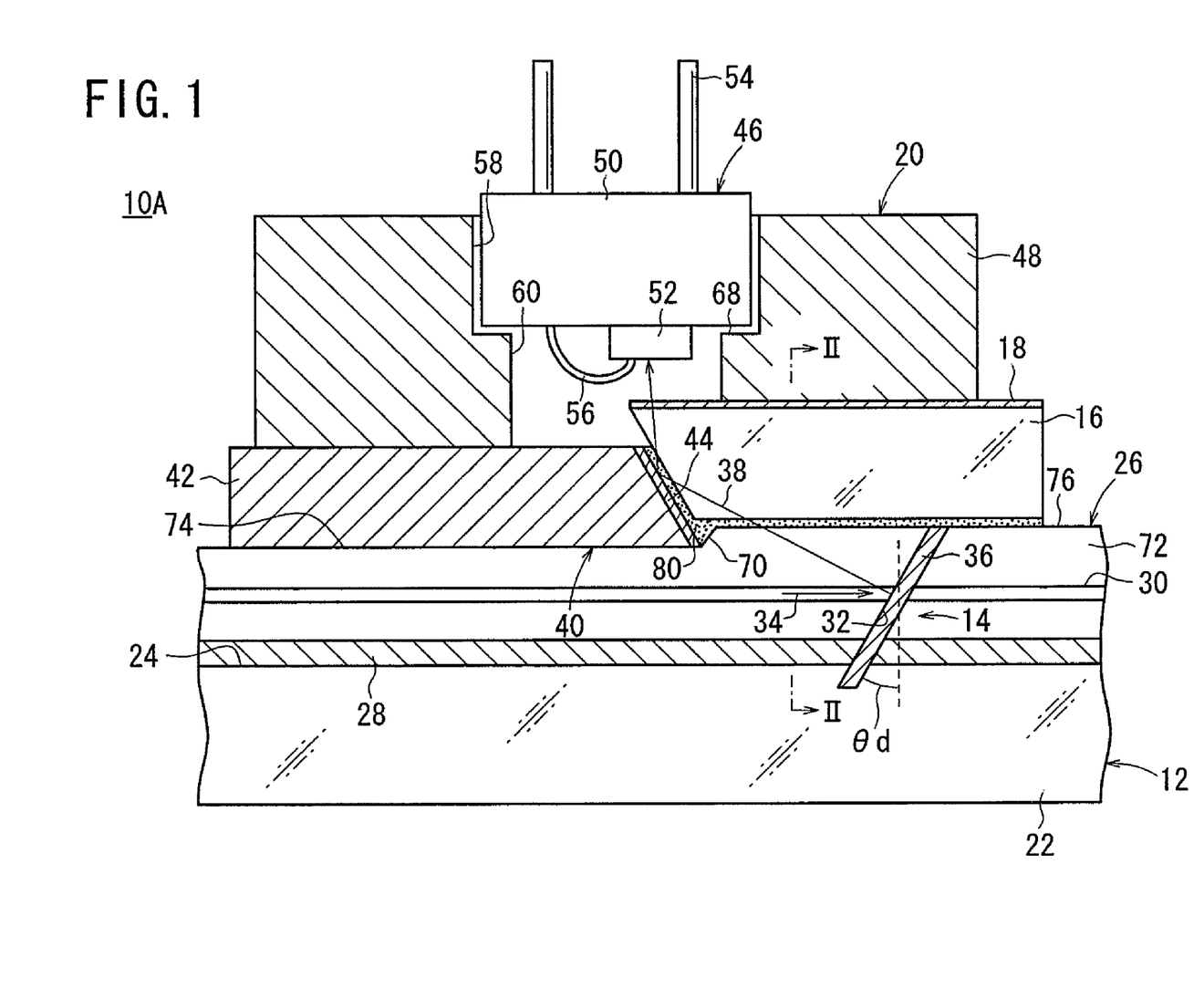
FIG. 1 is a fragmentary cross-sectional view of an optical device according to a first embodiment of the present invention.
Figure 2:
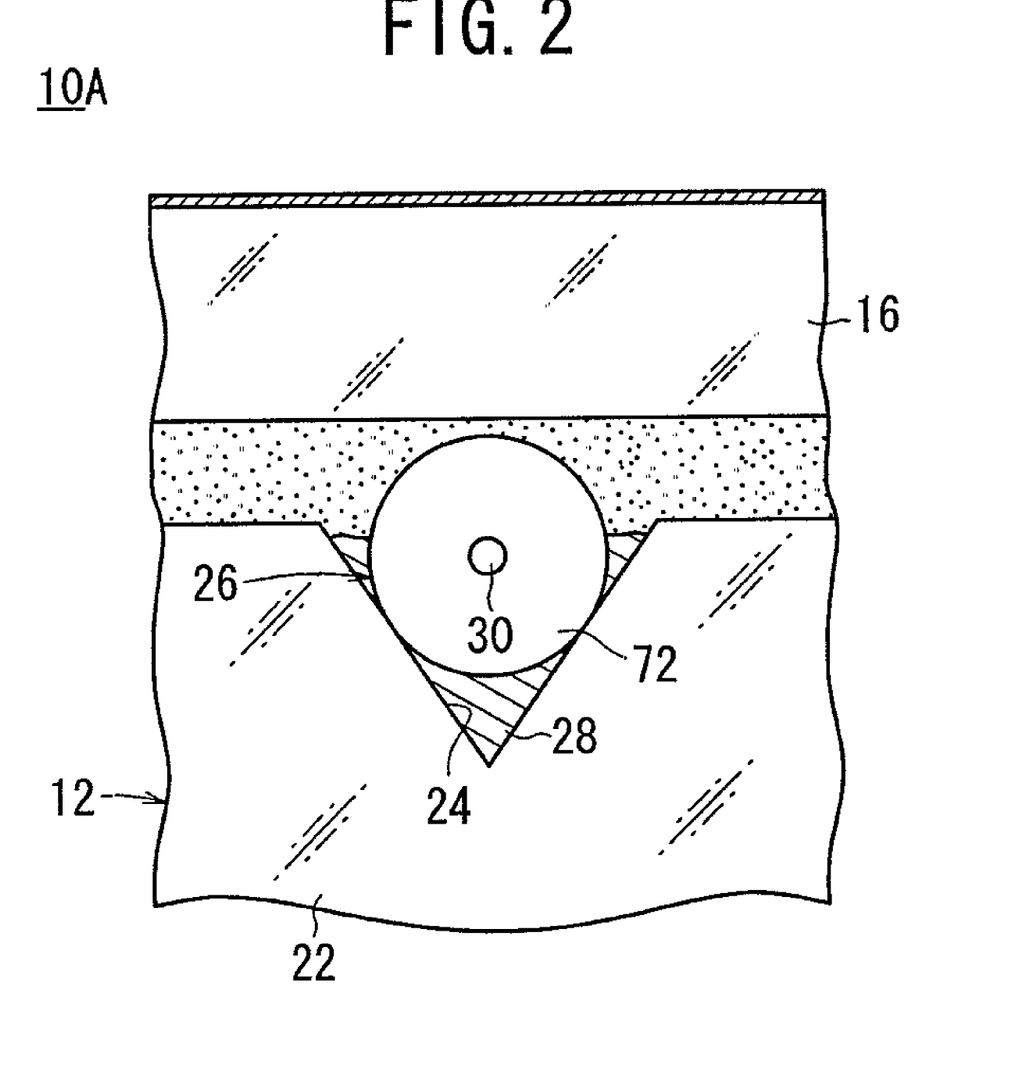
FIG. 2 is an enlarged cross-sectional view of the optical device taken along line II-II of FIG. 1.

As shown in FIGS. 1 and 2, an optical device 10A according to a first embodiment of the present invention comprises an optical fiber mount 12, an optical demultiplexer 14, a waveguide 16, a filter 18, and a light-detecting unit 20.

The optical fiber mount 12 comprises a glass substrate 22 with at least one fixing groove 24 in the form of a V-shaped groove (see FIG. 2) or a semicircular groove defined therein. An optical fiber 26 is fixedly secured in the fixing groove 24 by a securing adhesive 28.

The optical demultiplexer 14 has a slit 32 which is defined in the optical fiber 26 and the optical fiber mount 12 and extends obliquely across the optical axis of a core 30 of the optical fiber 26, and an optical demultiplexing member 36 inserted in the slit 32 for demultiplexing a portion of an optical signal beam 34 transmitted through the optical fiber 26, as a demultiplexed optical signal beam 38. The demultiplexed optical signal beam 38 from the optical demultiplexing member 36 is guided out of the optical fiber 26. The optical demultiplexing member 36 inserted in the slit 32 comprises a wavelength-division multiplexing filter (WDM filter) for demultiplexing an optical signal beam component in a certain wavelength range from the optical signal beam 34 transmitted through the optical fiber 26. The optical demultiplexing member 36 comprises a multilayer film disposed on the surface of a quartz glass sheet.

The slit 32 extends obliquely across the optical axis of the core 30 of the optical fiber 26 and has its lower end positioned below the bottom of the fixing groove 24. The slit 32 should preferably have a width ranging from 5 to 50 μm. If the width of the slit 32 is smaller than 5 μm, then the optical demultiplexing member 36 is too thin to be inserted easily in the slit 32. If the width of the slit 32 is greater than 50 μm, then the optical demultiplexing member 36 causes too large excess loss to lend itself to actual specifications. The depth of the slit 32 should preferably be in the range from 130 to 250 μm. If the depth of the slit 32 is smaller than 130 μm, then the fixing groove 24 may possibly terminate somewhere in the optical fiber 26 while it is being formed, and may possibly tend to serve as a starting point for causing damage to the optical fiber 26. If the depth of the slit 32 is greater than 250 μm, it may possibly invite a reduction in the mechanical strength of the glass substrate 22. A refractive index matching agent is placed between inner wall surfaces of the slit 32 and the optical demultiplexing member 36. In the present embodiment, the slit 32 has a width of 30 μm and is inclined to a line perpendicular to the optical axis of the optical fiber 26 by an angle θd of 8°. The line perpendicular to the optical axis of the optical fiber 26 will be referred to as a perpendicular line.

The filter 18 is disposed on the surface of the waveguide 16. The filter 18, which comprises a thin film, serves as a bandpass filter (BPF) for passing an optical signal beam in a particular wavelength range of the demultiplexed optical signal beam 38 from the optical demultiplexer 14. The BPF 18 has an attenuating level of about 40 dB in the cut-off range for the demultiplexed optical signal beam 38 from the optical demultiplexer 14, providing increased isolation between the pass range and the cut-off range.

An optical path changer 40 is disposed on the surface of the optical fiber 26 in juxtaposed relation to the waveguide 16. The optical path changer 40 is arranged to change the optical path of the demultiplexed optical signal beam 38 that has been guided out of the optical fiber 26.

The optical path changer 40 comprises a guide 42 made of glass or ceramics, for example, and a totally reflecting film 44 (totally reflecting mirror) disposed on an end face of the guide 42 which faces the waveguide 16. The end face of the guide 42 and an end face of the waveguide 16 which faces the guide optical path changer 40 are inclined through substantially the same angle. The guide 42 functions as a positioning member for mounting the waveguide 16 and also as a fixing member for securing the waveguide 16 in place.

The light-detecting unit 20 is disposed on the optical path of the demultiplexed optical signal beam 38 that has passed through the filter 18. The light-detecting unit 20 comprises a CAN-type photodiode 46 and a housing 48 housing the photodiode 46 therein.

The photodiode 46 has a base 50 and a chip 52 mounted on the base 50 and having a light-detecting surface. A wiring pattern (not shown) for electrical connection to a plurality of external terminals 54 is disposed on the base 50. The chip 52 is electrically connected to the wiring pattern by bonding wires 56. The housing 48 has a first through hole 58 defined therein which houses the photodiode 46 therein and a second through hole 60 defined therein which communicates with the first through hole 58. The demultiplexed optical signal beam 38 that has passed through the filter 18 passes through the second through hole 60. The second through hole 60 has an opening width smaller than the transverse width of the base 50. The second through hole 60 accommodates therein a light transmission medium which may be an adhesive having a refractive index that is substantially the same as the refractive index of the optical fiber 26 and the waveguide 16. The light transmission medium may alternatively be air.

If the light-detecting device is disposed over the substrate and has its light-detecting surface positioned on the optical path of the demultiplexed optical signal beam 38 from the optical demultiplexer 14, the light-detecting device may be mounted on the optical fiber mount 12 with a spacer interposed therebetween. However, since the optical path changer 40 and the waveguide 16 exist on the optical fiber 26, if such a spacer is employed, then difficulty arises in assembling and manufacturing the optical device, making it costly to manufacture the optical device.

With the optical device 10A according to the first embodiment, the photodiode 46 is accommodated in the first through hole 58 defined in the housing 48 of the light-detecting unit 20, and the demultiplexed optical signal beam 38 from the optical demultiplexer 14 passes through the second through hole 60 which communicates with the first through hole 58 and has an opening width smaller than the transverse width of the base 50 of the photodiode 46. A step 62 disposed between the first through hole 58 and the second through hole 60 serves as a spacer for the photodiode 46. Since the photodiode 46 can be installed in place simply by placing the housing 48 on the guide 42 and the waveguide 16, the first optical device 10A can easily be assembled and manufactured at a low cost.

The optical fiber 26 has a tapered surface 70 for positioning the optical path changer 40 in the first embodiment according to the present invention.

Specifically, the optical fiber 26 has a cladding layer 72 including a step defined axially between a lower step surface 74 and a higher step surface 76 of the cladding layer 72. The guide 42 of the optical path changer 40 is disposed on the lower step surface 74, and the waveguide 16 is disposed on the tapered surface 70 and the higher step surface 76, i.e., an upper surface of the cladding layer 72 having a regular thickness.

A gap between the surface of the optical fiber 26 and the waveguide 16 and a gap between the waveguide 16 and the optical path changer 40 are filled with a refractive index matching agent (adhesive) 80.

According to the first embodiment, the angle of incidence of the demultiplexed optical signal beam 38 on the filter 18 is 0.5° or greater.

Four specific structures wherein the angle of incidence of the demultiplexed optical signal beam 38 on the filter 18 is 0.5° or greater will be described below with reference to FIGS. 3A, 3B and 4A, 4B.

Figure 3A:
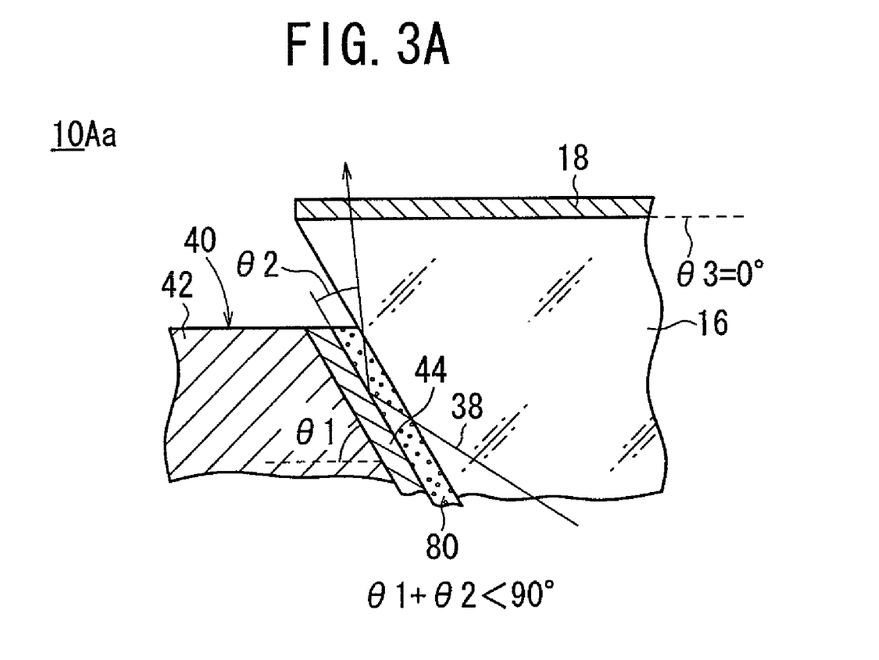
FIG. 3A is a fragmentary cross-sectional view of an optical device according to a first specific example.

As shown in FIG. 3A, an optical device 10Aa according to a first specific example is constructed such that if the totally reflecting film 44 is inclined to the optical axis of the optical fiber 26 by an angle $\theta1$, an angle $\theta2$ is formed between the demultiplexed optical signal beam 38 reflected by the totally reflecting film 44 and the totally reflecting film 44, and the optical filter 18 is inclined to the optical axis of the optical fiber 26 by an angle $\theta3$, then these angles satisfy the following equation (1):

$$|\{(\theta1+\theta2)-90°\}+\theta3| \geq 0.5° \qquad (1)$$

The angle $\theta2$ is determined when the optical signal beam propagated through the optical fiber 26 is reflected by the optical demultiplexing member 36, travels through the waveguide 16, and is then reflected by the totally reflecting film 44.

According to the first specific example, the angle $\theta3$ of inclination of the filter 18 is 0°, and the sum of the angles $\theta1+\theta2$ is smaller than 90°, in particular, smaller than 89.5°. These specific angle values satisfy the above equation (1). The structure can easily be realized by changing the angle $\theta1$ of inclination and changing the position of the slit 32 in the optical fiber 26.

Figure 3B:
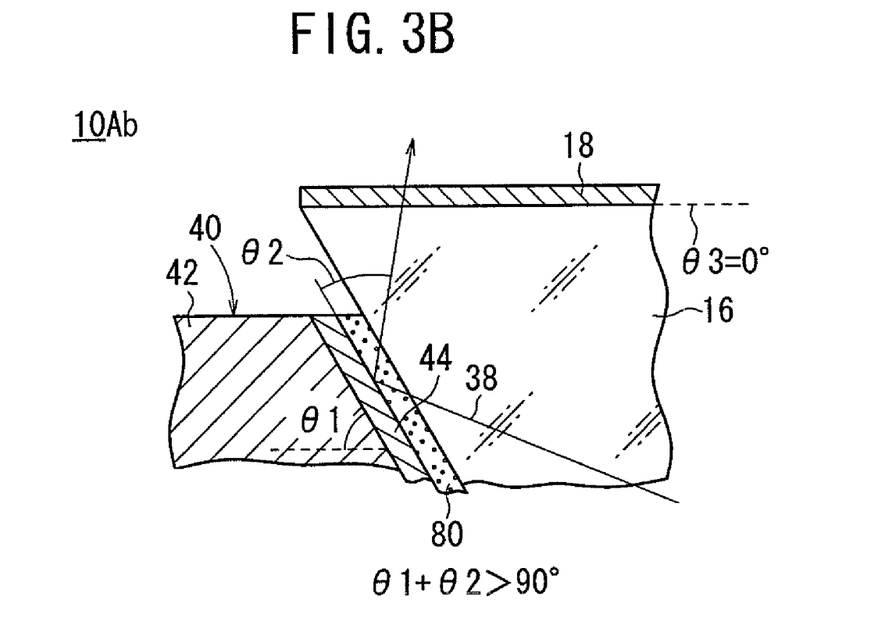
FIG. 3B is a fragmentary cross-sectional view of an optical device according to a second specific example.

As shown in FIG. 3B, an optical device 10Ab according to a second specific example resides in that the angle $\theta3$ of inclination of the filter 18 is 0°, and the sum of the angles $\theta1+\theta2$ is greater than 90°, in particular, equal to or greater than 90.5°. These specific angle values satisfy the above equation (1). The structure can easily be realized by changing the angle $\theta1$ of inclination and changing the position of the slit 32 in the optical fiber 26.

Figure 4A:
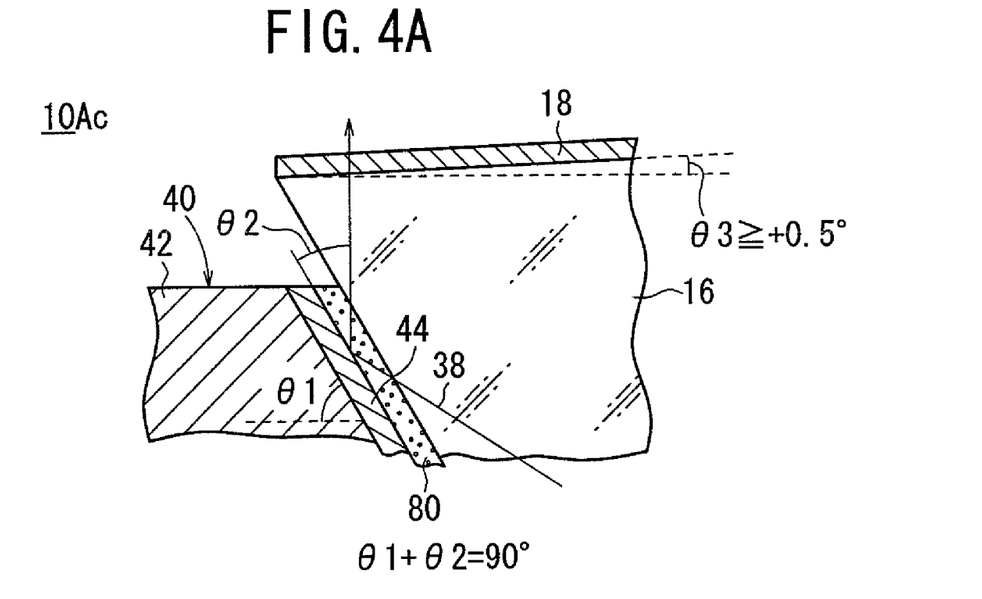
FIG. 4A is a fragmentary cross-sectional view of an optical device according to a third specific example.

As shown in FIG. 4A, an optical device 10Ac according to a third specific example resides in that the sum of the angles $\theta1+\theta2$ is 90°, and the angle $\theta3$ of inclination of the filter 18 is equal to or greater than +0.5°. These specific angle values satisfy the above equation (1). The structure can easily be realized by changing the angle $\theta3$ of inclination.

Figure 4B:
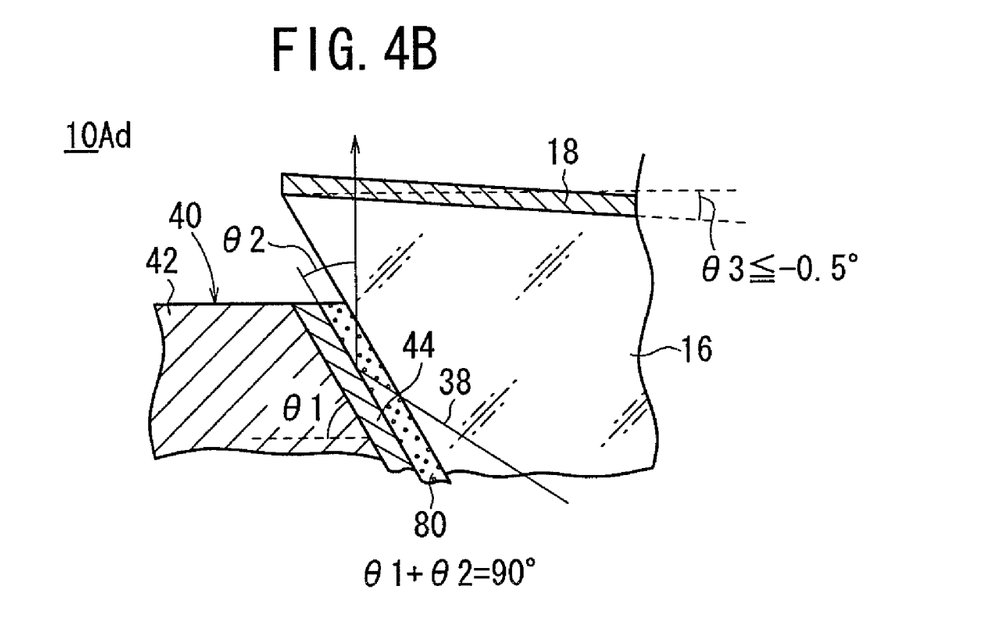
FIG. 4B is a fragmentary cross-sectional view of an optical device according to a fourth specific example.

As shown in FIG. 4B, an optical device 10Ad according to a fourth specific example resides in that the sum of the angles $\theta1+\theta2$ is 90°, and the angle $\theta3$ of inclination of the filter 18 is equal to or smaller than −0.5°. These specific angle values satisfy the above equation (1). The structure can easily be realized by changing the angle $\theta3$ of inclination.

In each of the optical devices 10Aa, 10Ab according to the first and second specific examples, the angle $\theta3$ of inclination is set to a specific value. In each of the optical devices 10Ac, 10Ad according to the third and fourth specific examples, the sum of the angles $\theta1+\theta2$ is set to a specific value. However, the values of the angles $\theta1$, $\theta2$, $\theta3$ may be varied to satisfy the above equation (1).

Operation of the optical device 10A according to the first embodiment will be described below. An optical signal beam component in a particular wavelength range of the optical signal beam 34 transmitted through the optical fiber 26 is demultiplexed by the optical demultiplexer 14, and guided as the demultiplexed optical signal beam 38 out of the optical fiber 26. Other optical signal beam components are transmitted as the optical signal beam 34 through the optical fiber 26.

The demultiplexed optical signal beam 38 that is guided out of the optical fiber 26 travels successively through the cladding layer 72 and the refractive index matching agent 80, and enters the waveguide 16. In the waveguide 16, the demultiplexed optical signal beam 38 travels substantially straight to the end face of the waveguide 16 and the refractive index matching agent 80, and then is applied to and reflected by the totally reflecting film 44 of the optical path changer 40 to change its optical path. The demultiplexed optical signal beam 38 is then propagated through the waveguide 16 and passes through the filter 18 on the surface of the waveguide 16.

If the demultiplexed optical signal beam 38 is applied perpendicularly to the filter 18, a portion of the demultiplexed optical signal beam 38 may be reflected by the surface of the filter 18, i.e., the interface between the filter 18 and air, and return as a reflected beam to the optical path changer 40, the optical demultiplexer 14, and the optical fiber 26.

In broadcasting services provided through the optical fiber 26, it is necessary to produce a large optical signal output level, and reflected beams should desirably be reduced because even weak reflected beams tend to serve as an unstable element in the overall system.

With the optical device 10A according to the first embodiment, since the angle of incidence of the demultiplexed optical signal beam 38 on the filter 18 is 0.5° or greater, the attenuated level of the reflected beam from the surface of the filter 18 is greater than if the demultiplexed optical signal beam 38 is applied perpendicularly to the filter 18.

Figure 5:
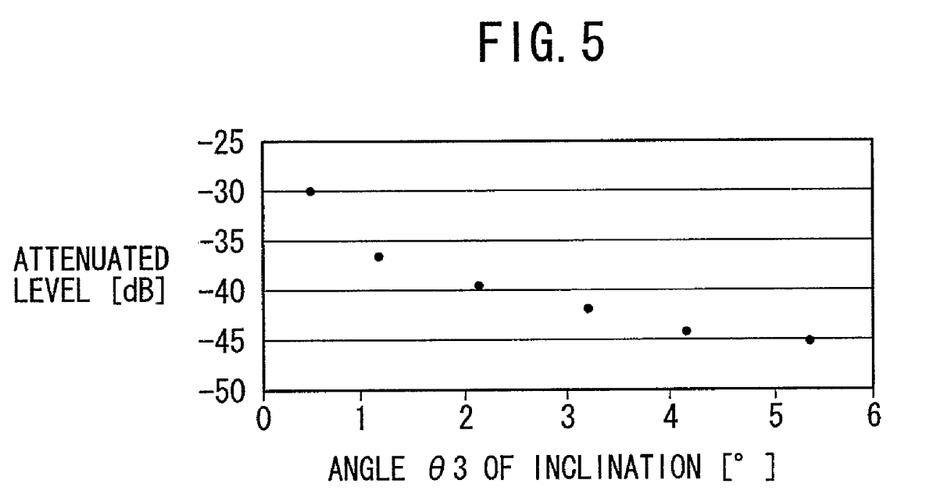
FIG. 5 is a diagram showing the results of an experiment which was conducted to observe attenuated levels of reflected light at different angles θ3 of inclination of a filter.

An experimental example will be described below. In the experimental example, the angle $\theta3$ of inclination of the filter 18 was changed to successive different values in the optical device 10Ac according to the third specific example shown in FIG. 4A, and the respective graduated levels of the reflected beams were measured. FIG. 5 shows the experimental results.

In FIG. 5, the attenuated level of the reflected beam is −30 dB when the angle $\theta3$ of inclination of the filter 18 is 0.5°, −36 dB when $\theta3=1.2°$, −40 dB when $\theta3=2.2°$, −42 dB when $\theta3=3.2°$, −44 dB when $\theta3=4.2°$, and −45 dB when $\theta3=5.4°$. By setting the angle $\theta3$ of inclination of the filter 18, i.e., the angle of incidence of the demultiplexed optical signal beam 38, to 0.5°, the reflected beam reflected from the surface of the filter 18, i.e., the interface between the filter 18 and air, and returning to the optical fiber 26 is attenuated to −30 dB. If the angle $\theta3$ of inclination of the filter 18 is 1° or greater, then the reflected beam can be attenuated more. Therefore, the reflected beam can sufficiently be attenuated even in view of the diffraction angle (spreading angle) of the demultiplexed optical signal beam 38.

The optical device 10A according to the first embodiment is fabricated according to the microslitting technology and has the filter 18 placed on the optical path of the demultiplexed optical signal beam 38. The optical device 10A is capable of effectively attenuating the beam reflected from the filter 18. Consequently, the optical device 10A allows a system incorporating a V-ONU-compatible optical device to have improved overall characteristics.

According to the first embodiment, since the tapered surface 70 on the surface of the optical fiber 26 doubles as a positioning member for positioning the optical path changer 40 with respect to the optical fiber 26, the optical device 10A can be assembled with ease.

The optical device 10A according to the first embodiment can be used to realize wavelength filter components, wavelength-multiplexing receiving devices, and transmitting/receiving devices without the need for lenses and optical transmission devices.

A wavelength filter component can be produced by inserting the wavelength demultiplexing filter into the slit 32, and a wavelength-multiplexing receiving device can be produced by installing the photodiode 46 for detecting the demultiplexed optical signal beam 38 which has been guided out of the optical fiber 26 from the optical demultiplexer 14.

With the filter 18 being in the form of a BPF, the filter 18 can provide better characteristics (a desired attenuating level in the cut-off range) if the angle of incidence of the beam on the filter 18 is smaller. If the angle of incidence of the beam on the filter 18 is simply to be reduced, then the optical path changer 40 for reducing the angle of incidence needs to be provided between the optical demultiplexer 14 and the photodiode 46, and the filter 18 needs to be provided between the optical path changer 40 and the photodiode 46. Therefore, the optical path from the optical demultiplexer 14 to the photodiode 46 has an increased length tending to increase the loss.

According to the first embodiment, however, a medium from which the beam is emitted to the optical path changer 40 or a medium from which the beam is emitted to the optical path changer 40 and to which the beam is emitted from the optical path changer 40 comprises the waveguide 16, and the filter 18 is disposed on the waveguide 16. Consequently, the angle of incidence of the beam on the filter 18 is reduced, and the length of the optical path from the optical demultiplexer 14 to the photodiode 46 is prevented from being increased. Furthermore, the medium from which the beam is emitted to the optical path changer 40 and the medium from which the beam is applied to the filter 18 are identical to each other, i.e., the waveguide 16. Therefore, the medium is optically uniform for better and stable characteristics.

As described above, the optical demultiplexing member 36 comprises a wavelength demultiplexing filter and the filter 18 comprises a BPF. Therefore, the attenuating level in the cut-off range may be of about 40 dB, for example, providing increased isolation between the pass range and the cut-off range.

Because the waveguide 16 is disposed directly above the optical fiber 26, the length of the optical path of the demultiplexed optical signal beam 38 is reduced, and the thickness of the refractive index matching agent 80 disposed between the optical fiber 26 and the waveguide 16 is also reduced. The optically unstable region (adhesive layer) is thus reduced for enhanced optical uniformity of the demultiplexing optical path.

An optical device 10B according to a second embodiment of the present invention will be described below with reference to FIG. 6.

Figure 6:
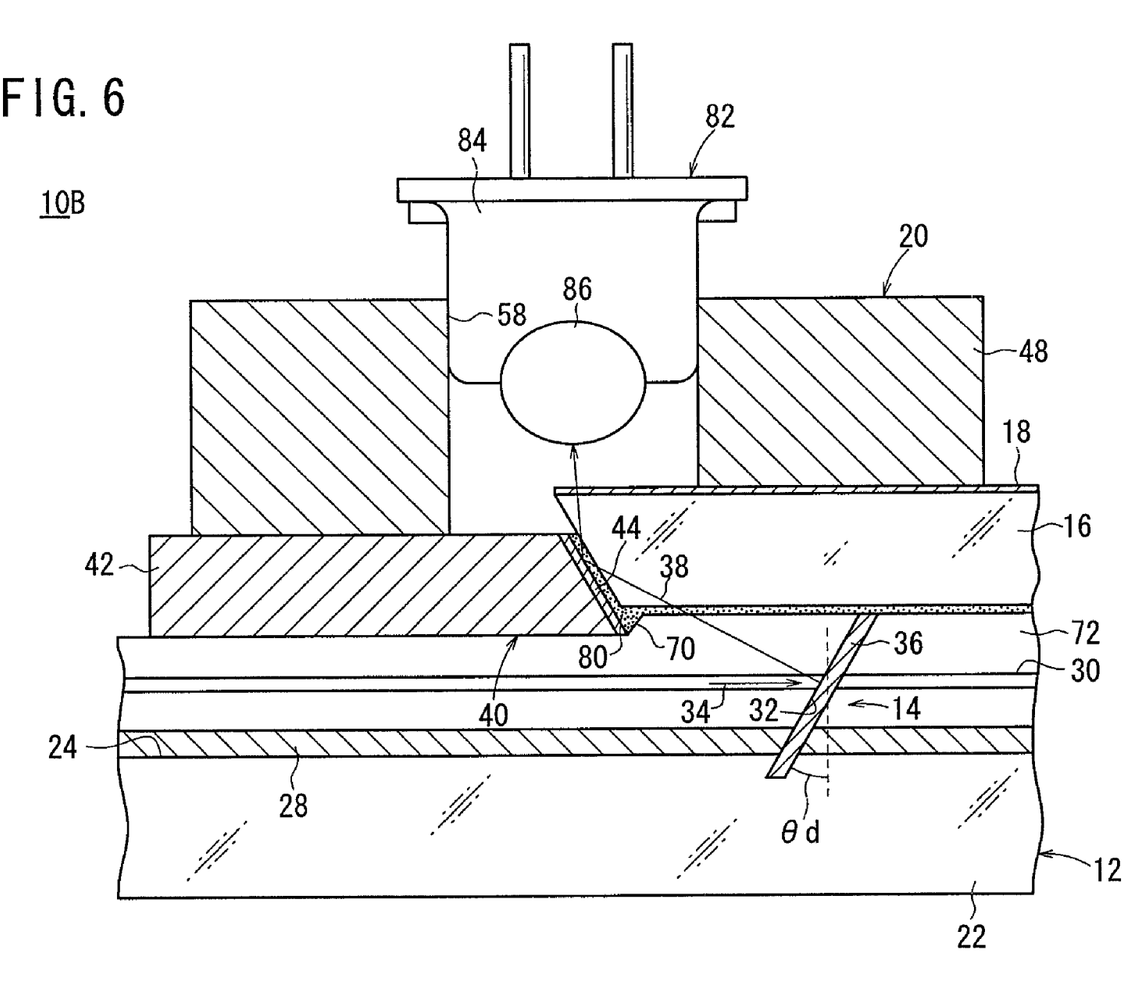
FIG. 6 is a fragmentary cross-sectional view of an optical device according to a second embodiment of the present invention.

As shown in FIG. 6, the optical device 10B differs from the optical device 10A in that a lens-combined CAN-type photodiode 82 is accommodated in the first through hole 58 in the housing 48.

The lens-combined CAN-type photodiode 82 comprises a CAN-type photodiode 84 and a ball lens 86 mounted thereon which has a diameter of 1.5 mm, for example. The ball lens 86 is accommodated in the first through hole 58 such that it faces the filter 18, thereby designing the optical device 10B with ease.

An optical device 10C according to a third embodiment of the present invention will be described below with reference to FIG. 7.

Figure 7:
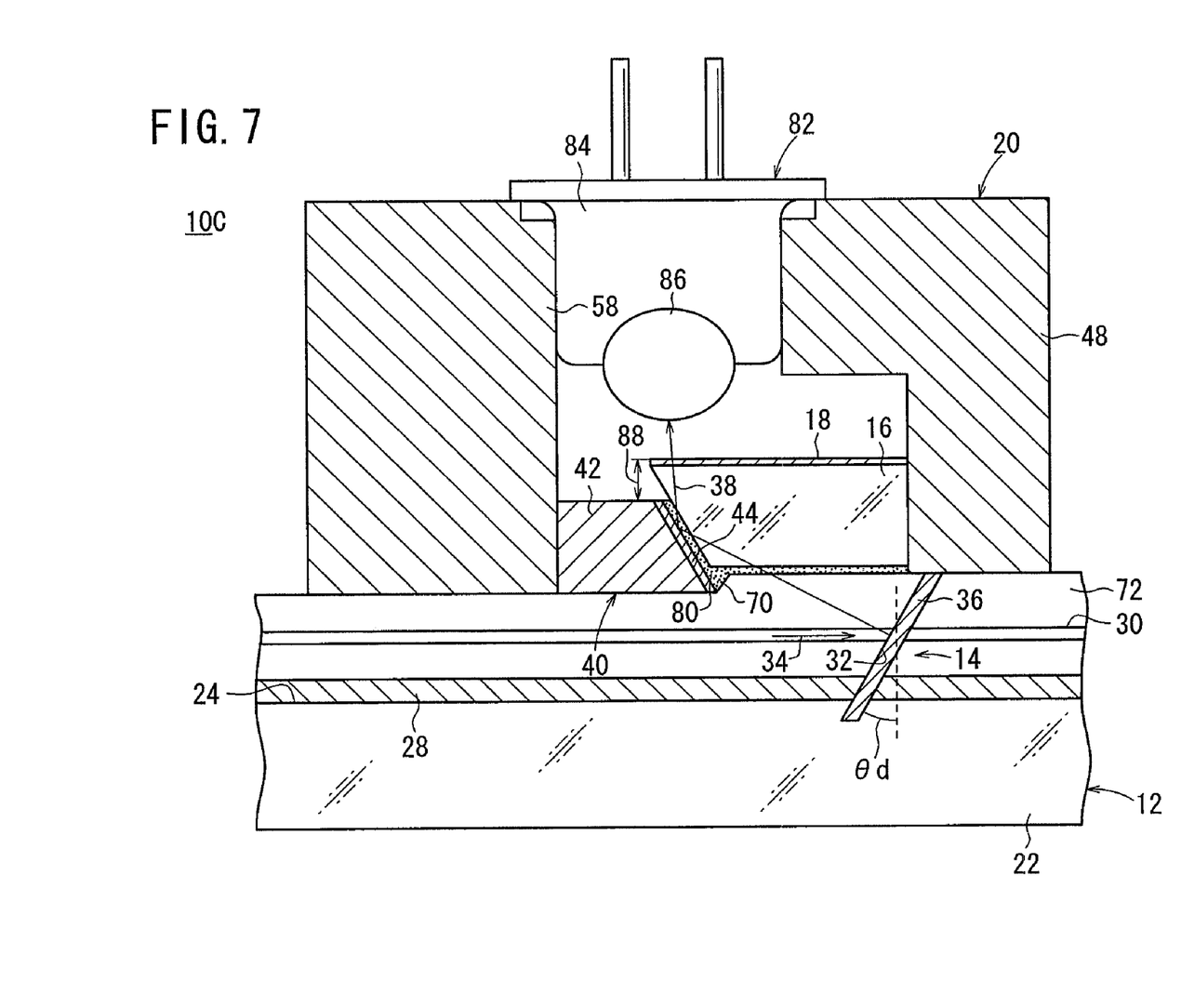
FIG. 7 is a fragmentary cross-sectional view of an optical device according to a third embodiment of the present invention.

As shown in FIG. 7, the optical device 10C differs from the optical device 10B according to the second embodiment in that the guide 42 of the optical path changer 40 and the waveguide 16 with the filter 18 disposed on the upper surface thereof are accommodated in the first through hole 58 in the housing 48.

The optical device 10C allows the filter 18 (thin film) to be formed in a reduced area for efficiently utilizing the thin film of the filter 18. A step 88 having a dimension ranging from 0.03 to 0.15 mm should preferably be disposed between the upper surface of the guide 42 and the upper surface of the waveguide 16. The step 88 is effective to prevent the refractive index matching agent 80 from protruding onto the surface of the filter 18 when the guide 42 and the waveguide 16 are installed in place.

An optical device 10D according to a fourth embodiment of the present invention will be described below with reference to FIG. 8.

Figure 8:
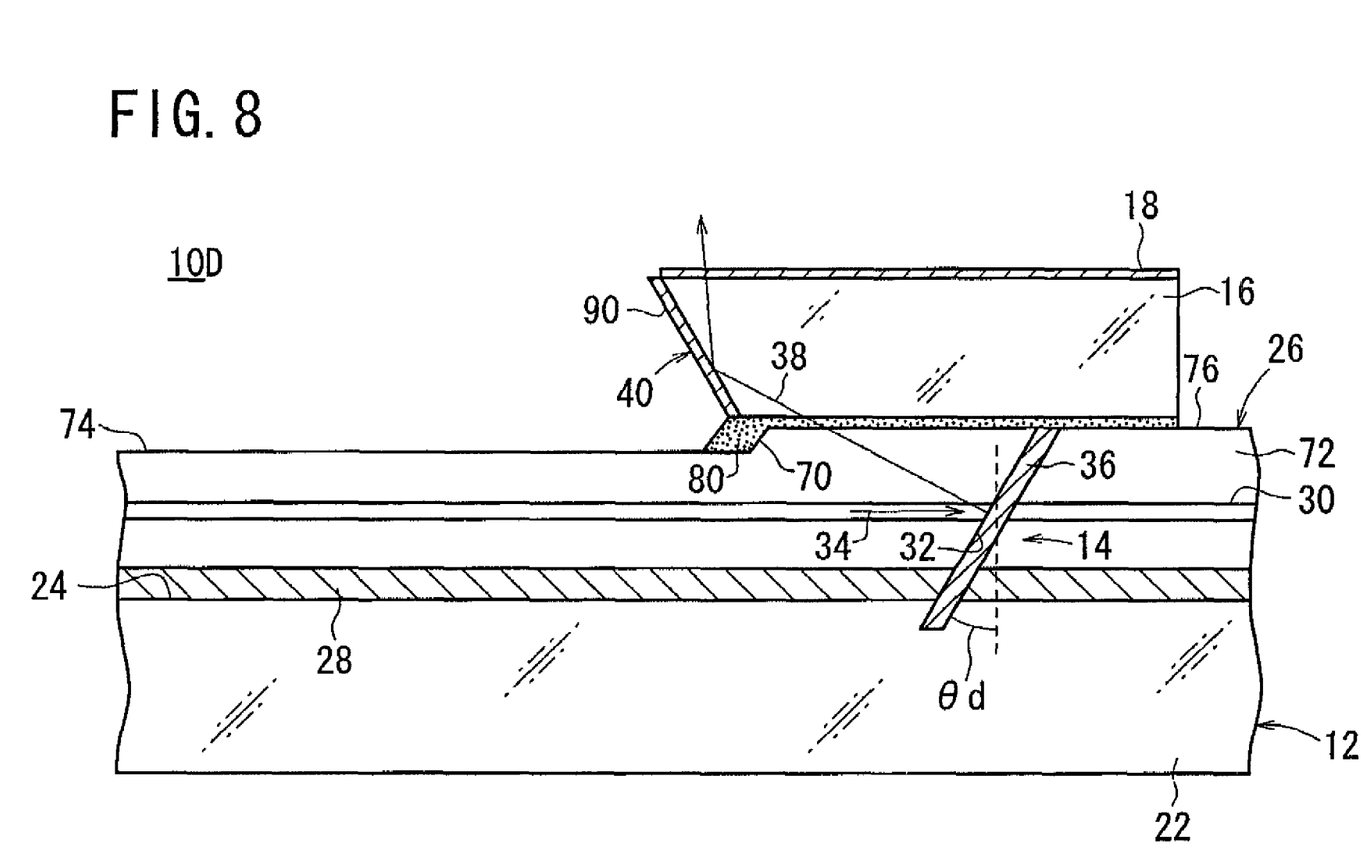
FIG. 8 is a fragmentary cross-sectional view of an optical device according to a fourth embodiment of the present invention.

As shown in FIG. 8, the optical device 10D is of substantially the same structure as the optical device 10A according to the first embodiment except that the optical path changer 40 comprises a totally reflecting film 90 disposed on the end face of the waveguide 16 which is present on the optical path of the demultiplexed optical signal beam 38, and the guide 42 (see FIG. 1) is dispensed with. The totally reflecting film 90 may comprise a thin metal film of Au (gold), Al (aluminum), or the like.

With the structure of the optical device 10D, the waveguide 16 can have a function to change the optical path of the demultiplexed optical signal beam 38 without the need for the guide 42 on the optical fiber 26. The optical device 10D is thus made up of a reduced number of parts, is manufactured by a simpler manufacturing process, suffers reduced manufacturing and assembling errors, and has the production efficiency improved.

Although certain preferred embodiments of the present invention have been shown and described in detail, it should be understood that various changes and modifications may be made therein without departing from the scope of the appended claims.

What is claimed is:

1. An optical device comprising:
   an optical fiber;
   an optical demultiplexer having an optical demultiplexing member for demultiplexing a portion of an optical signal beam transmitted through said optical fiber, as a demultiplexed optical signal beam, and guiding the demultiplexed optical signal beam out of said optical fiber;

an optical path changer for changing an optical path of said demultiplexed optical signal beam guided out of said optical fiber;

a waveguide serving as at least a medium from which said demultiplexed optical signal beam is emitted to said optical path changer; and a filter disposed on a surface of said waveguide;

wherein an angle of incidence of said demultiplexed optical signal beam on said filter is equal to or greater than 0.5°.

2. An optical device according to claim 1, wherein said angle of incidence of said demultiplexed optical signal beam on said filter is equal to or greater than 1°.

3. An optical device according to claim 1, wherein said optical path changer comprises a totally reflecting mirror, and if it is assumed that said totally reflecting mirror is inclined to the optical axis of said optical fiber by an angle $\theta 1$, an angle $\theta 2$ is formed between said demultiplexed optical signal beam reflected by said totally reflecting mirror and said totally reflecting mirror, and said optical filter is inclined to the optical axis of said optical fiber by an angle $\theta 3$, then said angles satisfy the following equation:

$$|\{(\theta 1+\theta 2)-90°\}+\theta 3|\geq 0.5°.$$

4. An optical device according to claim 1, wherein said optical demultiplexer has a slit defined in said optical fiber across an optical axis thereof, and said optical demultiplexing member inserted in the slit for demultiplexing the portion of the optical signal beam transmitted through said optical fiber.

5. An optical device according to claim 1, wherein said optical demultiplexing member comprises a wavelength demultiplexing filter, and said filter comprises a bandpass filter for passing a light beam in a particular wavelength range of said demultiplexed optical signal beam.

6. An optical device according to claim 1, wherein said waveguide serves as a medium from which said demultiplexed optical signal beam is emitted to said optical path changer and to which said demultiplexed optical signal beam is emitted from said optical path changer.

7. An optical device according to claim 1, wherein said waveguide is disposed directly above said optical fiber.

8. An optical device according to claim 1, wherein said optical path changer comprises:

a guide, said waveguide and said guide being juxtaposed on a surface of said optical fiber; and a totally reflecting film disposed on an end face of said guide which faces said waveguide.

9. An optical device according to claim 1, wherein said optical path changer comprises a totally reflecting film disposed on an end face of said waveguide which is present on the optical path of said demultiplexed optical signal beam.

10. An optical device according to claim 1, further comprising:

a light-detecting unit disposed on the optical path of said demultiplexed optical signal beam which has passed through said filter disposed on the surface of said waveguide.

* * * * *